(12) United States Patent
Kato et al.

(10) Patent No.: US 6,509,594 B2
(45) Date of Patent: Jan. 21, 2003

(54) SEMICONDUCTOR MEMORY DEVICE HAVING MFMIS TRANSISTOR AND INCREASED DATA STORAGE TIME

(75) Inventors: Yoshihisa Kato, Shiga (JP); Yasuhiro Shimada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/874,319

(22) Filed: Jun. 6, 2001

(65) Prior Publication Data

US 2001/0050378 A1 Dec. 13, 2001

(30) Foreign Application Priority Data

Jun. 12, 2000 (JP) ........................................ 2000-175067

(51) Int. Cl.⁷ ............................................. H01L 31/062
(52) U.S. Cl. ........................................ 257/295; 257/315
(58) Field of Search ................................. 257/295, 315; 365/145

(56) References Cited

U.S. PATENT DOCUMENTS

| 6,151,241 A | * | 11/2000 | Hayashi et al. | ............. 365/145 |
| 6,188,600 B1 | * | 2/2001 | Ishiwara | ..................... 365/145 |
| 6,285,577 B1 | * | 9/2001 | Nakamura | ................... 365/145 |

* cited by examiner

*Primary Examiner*—David Nelms
*Assistant Examiner*—Tu-Tu Ho
(74) *Attorney, Agent, or Firm*—Nixon Peabody LLP; Donald R. Studebaker

(57) ABSTRACT

The semiconductor memory of this invention includes an MFMIS transistor including a field effect transistor and a ferroelectric capacitor formed above the field effect transistor. The semiconductor memory has a characteristic that a value of ($\sigma-p$) is substantially not changed with time in a relational expression, $V=(d/\epsilon_0)\times(\sigma-p)$, which holds among a potential difference $V$ between an upper electrode and a lower electrode, a surface density of charge $\sigma$ of a ferroelectric film, polarization charge $p$ of the ferroelectric film, a thickness $d$ of the ferroelectric film and a dielectric constant $\epsilon_0$ of vacuum when a data is written in the MFMIS transistor and the ferroelectric film is in a polarized state.

2 Claims, 2 Drawing Sheets

SEMICONDUCTOR MEMORY DEVICE HAVING MFMIS TRANSISTOR AND INCREASED DATA STORAGE TIME

BACKGROUND OF THE INVENTION

The present invention relates to a semiconductor memory including an MFMIS transistor having a ferroelectric capacitor provided on a field effect transistor.

An MFMIS transistor having a ferroelectric capacitor provided on a field effect transistor has a Metal/Ferroelectric/Metal/Insulator/Semiconductor multi-layer structure and includes a field effect transistor formed on a semiconductor substrate and a ferroelectric capacitor formed above the field effect transistor with an insulating film sandwiched therebetween with the gate electrode of the field effect transistor electrically connected to the lower electrode of the ferroelectric capacitor.

A circuit configuration of a semiconductor memory including the MFMIS transistor having the aforementioned structure will now be described with reference to FIG. 2.

As shown in FIG. 2, the MFMIS transistor includes a field effect transistor 10 and a ferroelectric capacitor 20 provided above the field effect transistor 10. The field effect transistor 10 includes a p-type well region 11, a drain electrode 12, a source electrode 13 and a gate electrode 14, and the ferroelectric capacitor 20 includes a lower electrode 21, a ferroelectric film 22 and an upper electrode 23. The gate electrode 14 of the field effect transistor 10 is electrically connected to the lower electrode 21 of the ferroelectric capacitor 20 so that the gate electrode 14 of the field effect transistor 10 can work as a floating gate of the MFMIS transistor, and the upper electrode 23 of the ferroelectric capacitor 20 is connected to a control gate 24.

When a voltage positive or negative with respect to the well region 11 is applied to the control gate 24, the polarization direction of the ferroelectric film 22 turns downward or upward. Therefore, even when the control gate 24 is grounded thereafter, the floating gate 14 keeps a potential positive or negative with respect to the well region 11. In the case where the potential of the floating gate 14 is positive, the field effect transistor 10 is always in an on-sate as far as the potential of the floating gate 14 is higher than the threshold voltage of the field effect transistor 10. In the case where the potential of the floating gate 14 is negative, the field effect transistor 10 is always in an off-state regardless of the magnitude of the potential of the floating gate 14.

Therefore, the on-state and the off-state of the field effect transistor 10 are allowed to respectively correspond to a data "1" and a data "0", so that the MFMIS transistor can store a binary data, and the binary data can be read any time by detecting change of a drain/source current of the field effect transistor 10.

Accordingly, in the semiconductor memory including the MFMIS transistor, the stored data can be kept even when the voltage applied to the gate electrode (floating gate) 14 of the field effect transistor is lowered to 0 V by shutting off the power.

In the conventional semiconductor memory, however, the time duration for storing a data is restricted to as short as approximately 15 hours.

Now, the cause of the restriction in the data storage time of the conventional semiconductor memory will be described.

FIG. 3 is a diagram of an equivalent circuit of the MFMIS transistor of FIG. 2 in a data storage state. In FIG. 3, $C_{OX}$ indicates a capacitance value of the gate insulating film, $C_f$ indicates a capacitance value of the ferroelectric film 22 and R indicates a resistance component generated by the resistance of the ferroelectric film 22.

The lower electrode 21 and the upper electrode 23 of the ferroelectric capacitor 20 are not completely insulated from each other but there is finite resistance of $1 \times 10^{10}$ $\Omega \cdot cm^2$ at most therebetween.

The capacitance value $C_{OX}$ of the gate insulating film of the field effect transistor 10 is approximately 0.5 $\mu F/cm^2$ when the gate insulating film is formed from a silicon oxide film with a thickness of 10 nm. Also, the capacitance value $C_f$ of the ferroelectric film 22 of the ferroelectric capacitor 20 is approximately 5 $\mu F/cm^2$ when the ferroelectric film 22 has a thickness of 100 nm.

Accordingly, when the initial potential of the floating gate 14 is indicated by $V_0$ and the potential of the floating gate 14 attained after t hours is indicated by V, the voltage V is represented as follows:

$$V = V_0 \times e^{-t/CR} \quad (1)$$

wherein CR is a time constant and C is combined capacitance of $C_{OX}$ and $C_f$ represented as follows:

$$C = C_{OX} + C_f \quad (2)$$

Accordingly, the following relationship holds:
CR=(0.5+5)×10⁻⁶×10¹⁰=5.5×10⁴ (seconds)≈15 hours In consideration of the future use of a semiconductor memory including an MFMIS transistor, however, the data storage time is desired to be approximately 10 years (≈3×10⁸ seconds).

SUMMARY OF THE INVENTION

Accordingly, an object of the invention is largely increasing the data storage time of a semiconductor memory including an MFMIS transistor as compared with that of the conventional semiconductor memory.

In order to achieve the object, the semiconductor memory of this invention comprises an MFMIS transistor including a field effect transistor and a ferroelectric capacitor formed above the field effect transistor, and the semiconductor memory has a characteristic that a value of (σ–p) is substantially not changed with time in a relational expression, V=(d/ε₀)×(σ–p), which holds among a potential difference V between an upper electrode and a lower electrode, a surface density of charge σ of a ferroelectric film, polarization charge p of the ferroelectric film, a thickness d of the ferroelectric film and a dielectric constant ε₀ of vacuum when a data is written in the MFMIS transistor and the ferroelectric film is in a polarized state.

In the semiconductor memory of this invention, since the value of (σ–p) is substantially not changed with time in the relational expression, V=(d/ε₀)×(σ–p), the potential difference V between the upper electrode and the lower electrode is not changed with time. Accordingly, a data written in the MFMIS transistor can be read after a very long period of time such as approximately 10 years (≈3×10⁸ seconds).

In the semiconductor memory, the thickness d of the ferroelectric film is preferably set to a value larger than a mean free path of carriers present in the upper electrode or the lower electrode.

In this manner, a carrier present in the upper electrode or the lower electrode is definitely trapped by a trapping level before reaching the opposing electrode (the lower electrode or the upper electrode), and hence, the value of (σ–p) is not substantially changed with time. Accordingly, the potential difference V between the upper electrode and the lower electrode is substantially constant, so that a data can be stored for a sufficiently long period of time.

DETAILED DESCRIPTION OF THE INVENTION

A semiconductor memory according to a preferred embodiment of the invention will now be described with reference to FIG. 1.

Figure 1:
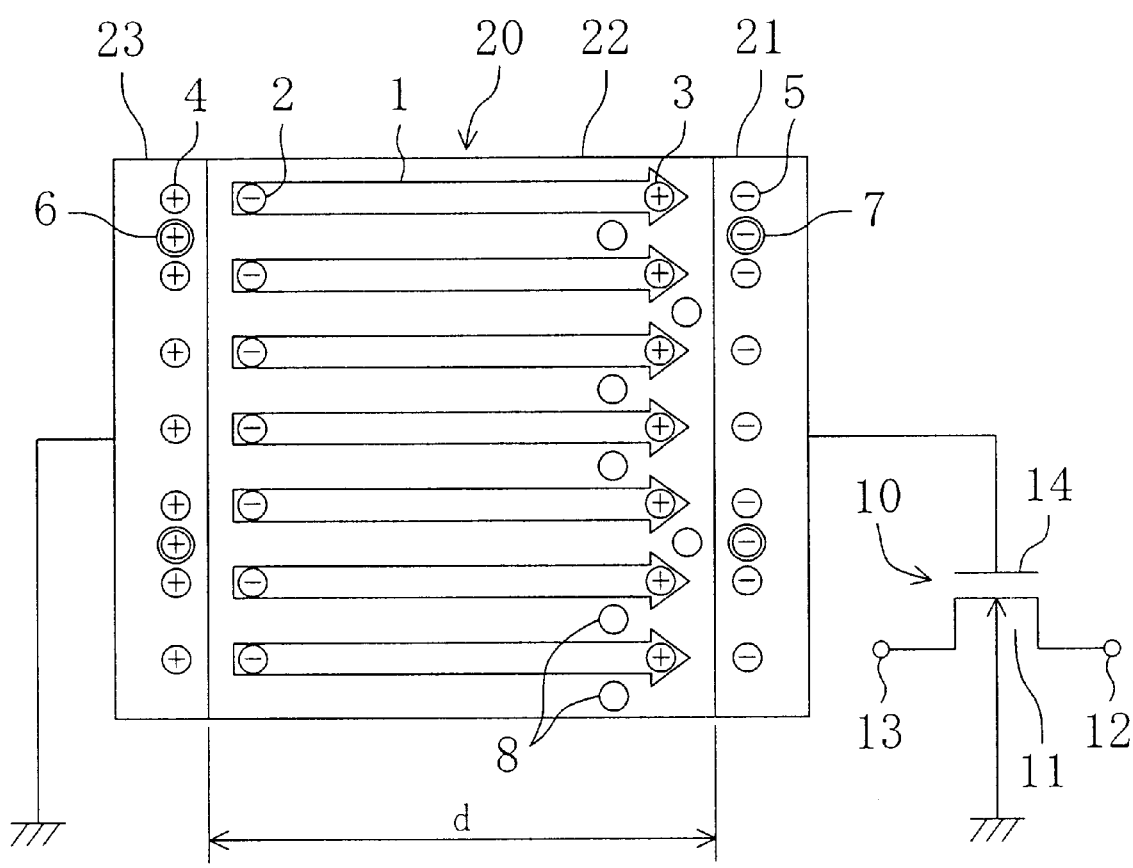
FIG. 1 is a schematic cross-sectional view of a semiconductor memory according to an embodiment of the invention in a data storage state.
Figure 2:
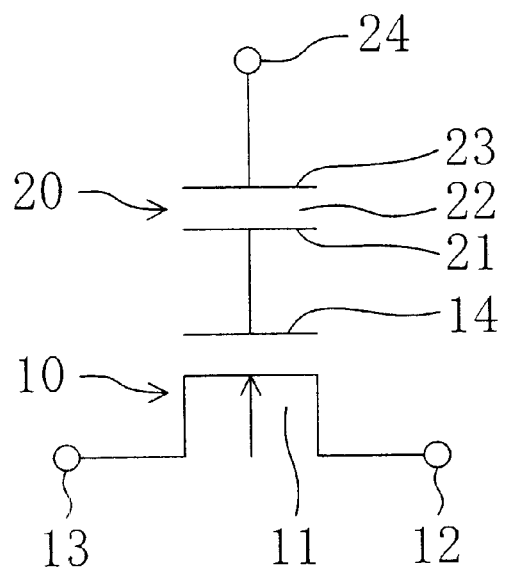
FIG. 2 is a circuit diagram of an MFMIS transistor included in a semiconductor memory according to the invention and the conventional technique.
Figure 3:
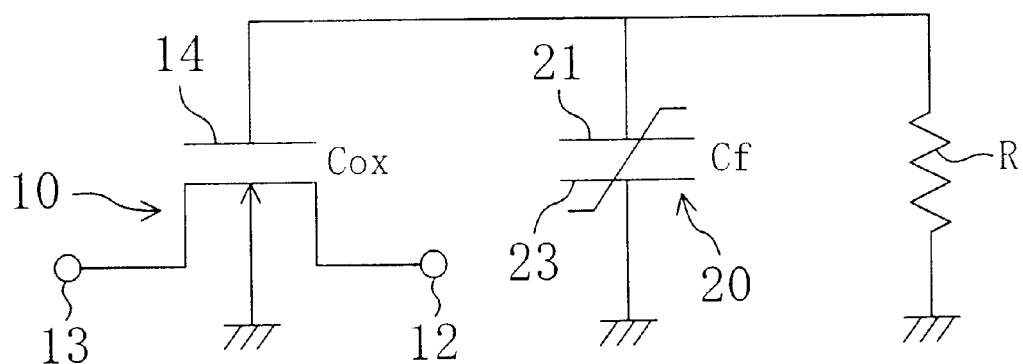
FIG. 3 is an equivalent circuit diagram of the MFMIS transistor included in the semiconductor memory according to the invention and the conventional technique.

FIG. 1 is a schematic cross-sectional view of the semiconductor memory of this embodiment in a data storage state. As shown in FIG. 1, an MFMIS transistor includes a field effect transistor 10 and a ferroelectric capacitor 20 formed above the field effect transistor 10. The field effect transistor 10 includes a p-type well region 11, a drain electrode 12, a source electrode 13 and a gate electrode 14, and the ferroelectric capacitor 20 includes a lower electrode 21, a ferroelectric film 22 and an upper electrode 23. The gate electrode 14 of the field effect transistor 10 is electrically connected to the lower electrode 21 of the ferroelectric capacitor 20.

The semiconductor memory of this embodiment is characterized by having the following characteristic: In the relational expression, $V=(d/\epsilon_0) \times (\sigma-p)$, which holds among a potential difference V between the upper electrode and the lower electrode, a surface density of charge σ of the ferroelectric film, polarization charge p of the ferroelectric film, the thickness d of the ferroelectric film and a dielectric constant $\epsilon_0$ of vacuum when a data is written in the MFMIS transistor so as to place the ferroelectric film in a polarized state, a value of (σ–p) is not substantially changed with time. Specifically, the thickness d of the ferroelectric film 22 is set to a value larger than the mean free path L of carriers (holes or electrons) present in the lower electrode 21 or the upper electrode 23. The mean free path L of carriers means an average distance traveled by the carriers moving in the ferroelectric film 22 until they are eliminated or shut off by being trapped by trapping levels distributed in the ferroelectric film 22.

The mean free path L of carriers depends upon the number of trapping levels per unit volume of the ferroelectric film 22, namely, the density of the trapping levels. Therefore, the mean free path L of carriers can be controlled by adjusting the density of the trapping levels by controlling the burning temperature or time employed in forming the ferroelectric film 22.

Now, with reference to FIG. 1, the reason why a potential difference between the upper electrode 23 and the lower electrode 21 can be kept for a sufficiently long time by setting the thickness d of the ferroelectric film 22 to be larger than the mean free path L of carriers will be described.

In FIG. 1, a reference numeral 1 denotes polarization in the ferroelectric film 22, a reference numeral 2 denotes negative polarization charge and a reference numeral 3 denotes positive polarization charge. Also, a reference numeral 4 denotes a hole present in the upper electrode 23 so as to correspond to the negative polarization charge 2 (namely, to be cancelled by the negative polarization charge 2), a reference numeral 5 denotes an electron present in the lower electrode 21 so as to correspond to the positive polarization charge 3 (namely, to be cancelled by the positive polarization charge 3), a reference numeral 6 denotes a hole present in the upper electrode 23 so as to cause a potential difference from the potential of the lower electrode 21, a reference numeral 7 denotes an electron present in the lower electrode 21 so as to cause a potential difference from the potential of the upper electrode 23, and a reference numeral 8 denotes a trapping level for trapping a carrier.

As shown in FIG. 1, when the polarization 1 of the ferroelectric film 22 is in a direction toward the lower electrode 21, the hole 6 causing a potential difference is present in the upper electrode 23 and the electron 7 causing a potential difference is present in the lower electrode 21. For example, when the hole 6 of the upper electrode 23 moves in the ferroelectric film 22 to reach the lower electrode 21 and is coupled with the electron 7 of the lower electrode 23, the potential difference between the upper electrode 23 and the lower electrode 21 is lowered.

However, since the thickness d of the ferroelectric film 22 is larger than the mean free path L of carriers, the hole 6 of the upper electrode 23 is probably inevitably trapped by the trapping level 8 while it is moving in the ferroelectric film 22. Therefore, the hole 6 of the upper electrode 23 never reaches the lower electrode 21, and hence is never coupled with the electron 7 of the lower electrode 21. As a result, the potential difference between the upper electrode 23 and the lower electrode 21 is never lowered.

This phenomenon will now be electromagnetically described.

When the intensity of the electric field of the ferroelectric film 22 is indicated by E, the dielectric constant of vacuum is indicated by $\epsilon_0$, the surface density of charge of the upper electrode 23 is indicated by σ and the magnitude of the polarization charge obtained in the ferroelectric film 22 immediately after storing a data is indicated by p, $\epsilon_0 \times E + p = \sigma$ according to Gauss' theorem, and hence, $E=(\sigma-p)/\epsilon_0$.

The potential difference V between the upper electrode 23 and the lower electrode 21 is represented as $V = E \times d = (d/\epsilon_0) \times (\sigma-p)$. In other words, the potential difference V between the upper electrode 23 and the lower electrode 21 is caused by a difference between the surface density of charge σ of the upper electrode 23 and the polarization charge p of the ferroelectric film 22. The potential difference V between the upper electrode 23 and the lower electrode 21 is positive (namely, V>0), and hence, σ>p.

If the surface charge of the upper electrode 23 reaches the lower electrode 21 due to current leakage so as to eliminate the surface charge of the upper electrode 23, since the polarization charge p of the ferroelectric film 22 is constant and the surface density of charge σ of the upper electrode 23 alone is reduced, σ=p, namely, V=0 after a sufficiently long time.

However, when the surface charge of the upper electrode 23 is definitely trapped by the trapping level 8 before reaching the lower electrode 21, the polarization charge p of the ferroelectric film 22 is reduced correspondingly to the reduction of the surface density of charge σ of the upper electrode 23. Accordingly, even after a sufficiently long time, the relationship of a σ>p is kept, so that the potential difference V between the upper electrode 23 and the lower electrode 21 can be constant.

Accordingly, when the semiconductor memory has a characteristic that, in the relational expression, $V=(d/\epsilon_0)\times(\sigma-p)$, which holds among the potential difference V between the upper electrode 23 and the lower electrode 21, the surface density of charge σ of the ferroelectric film 22, the polarization charge p of the ferroelectric film 22, the thickness d of the ferroelectric film 22 and the dielectric constant $\epsilon_0$ of vacuum when a data is written in the MFMIS transistor so as to place the ferroelectric film 22 in a polarized state, a value of (σ−p) is not substantially changed with time as in this embodiment, the potential difference V between the upper electrode 23 and the lower electrode 21 is constant. As a result, a data can be stored for a sufficiently long period of time.

Also, as described above, since the thickness d of the ferroelectric film 22 is larger than the mean free path L of carriers in this embodiment, the surface charge of the upper electrode 23 is definitely trapped by the trapping level 8 before reaching the lower electrode 21, and hence, the value of (σ−p) is not substantially changed with time. As a result, the potential difference V between the upper electrode 23 and the lower electrode 21 is constant, so that a data can be stored for a sufficiently long period of time.

What is claimed is:

1. A semiconductor memory comprising an MFMIS transistor including a field effect transistor and a ferroelectric capacitor formed above said field effect transistor, wherein said semiconductor memory has a characteristic in which a value of (σ−p) is substantially constant over time in a relational expression, $V=(d/\epsilon_0)\times(\sigma-p)$, wherein V≠0, which holds among a potential difference V between an upper electrode and a lower electrode, a surface density of charge σ of a ferroelectric film, polarization charge p of said ferroelectric film, a thickness d of said ferroelectric film and a dielectric constant $\epsilon_0$ of said ferroelectric film and a dielectric constant $\epsilon_0$ of vacuum when a data is written in said MFMIS transistor and said ferroelectric film is in a polarized state.

2. The semiconductor memory of claim 1, wherein the thickness d of said ferroelectric film is set to a value larger than a mean free path of carriers present in said upper electrode or said lower electrode.

\* \* \* \* \*